United States Patent [19]

Gaultier

[11] Patent Number: 5,258,955
[45] Date of Patent: Nov. 2, 1993

[54] PRE-CHARGING METHOD FOR THE READING OF MEMORIES

[75] Inventor: Jean-Marie Gaultier, Lotissement La Pinede, France

[73] Assignee: SGS-Thomson Microelectronics, S.A., Gentilly, France

[21] Appl. No.: 765,541

[22] Filed: Sep. 25, 1991

[30] Foreign Application Priority Data

Sep. 25, 1990 [FR] France ................ 90 11817

[51] Int. Cl.$^5$ .................................. G11C 7/06
[52] U.S. Cl. .......................... 365/203; 365/204; 365/208
[58] Field of Search .......... 365/203, 204, 189.11, 365/196, 207, 208, 225

[56] References Cited

U.S. PATENT DOCUMENTS

| | | | |
|---|---|---|---|
| 3,932,848 | 1/1976 | Porat | 365/204 |
| 4,851,894 | 7/1989 | de Ferron | 357/51 |
| 4,899,066 | 2/1990 | Aikawa et al. | 365/204 |
| 4,947,375 | 8/1990 | Gaultier | 365/200 |
| 4,962,482 | 10/1990 | Jinbo | 365/189.11 |
| 5,007,026 | 4/1991 | Gaultier | 365/201 |
| 5,012,448 | 4/1991 | Matsuoka et al. | 365/208 |

FOREIGN PATENT DOCUMENTS

| | | |
|---|---|---|
| 0204488 | 12/1986 | European Pat. Off. |
| 0246139 | 11/1987 | European Pat. Off. |
| 0319066 | 7/1989 | European Pat. Off. |
| 0329141 | 8/1989 | European Pat. Off. |
| 2587531 | 3/1987 | France |
| 57-12483 | 1/1982 | Japan |
| 9003033 | 3/1990 | World Int. Prop. O. |

OTHER PUBLICATIONS

Patent Abstracts of Japan, vol. 6, No. 75 (P-114), published Jan. 22, 1982.

*Primary Examiner*—Eugene R. LaRoche
*Assistant Examiner*—Vu Le

[57] ABSTRACT

A pre-charging and reading circuit for an integrated circuit memory comprises a pre-charging transistor and an inverter looped between the source and the gate of the pre-charging transistor to constitute a servo-control circuit imposing a set value of pre-charging voltage on the bit line. To accelerate the pre-charging without causing deterioration in the operation during the reading proper, the characteristics of the servo-control circuit are modified during a pre-charging stage so that the set value voltage imposed during the pre-charging stage is higher than the set value voltage imposed during the reading stage. A sequencer puts a transistor N'1 or a transistor N1 into operation as an N channel transistor of the inverter, depending on whether the stage in progress is a pre-charging stage or a reading stage.

12 Claims, 2 Drawing Sheets

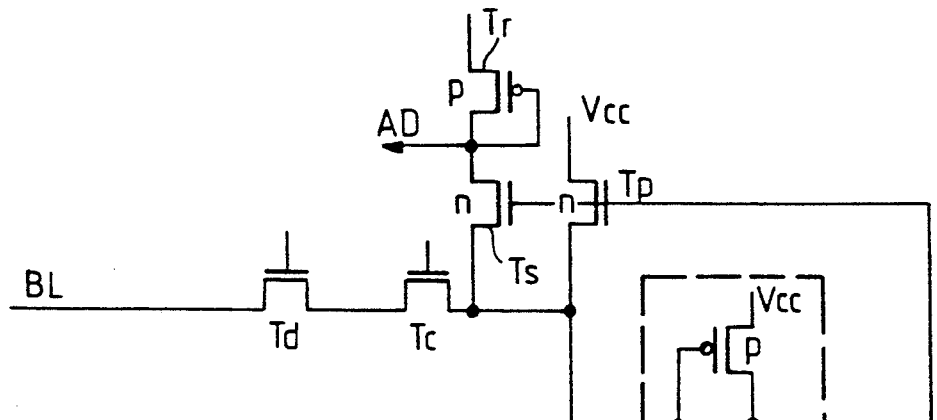
FIG_1
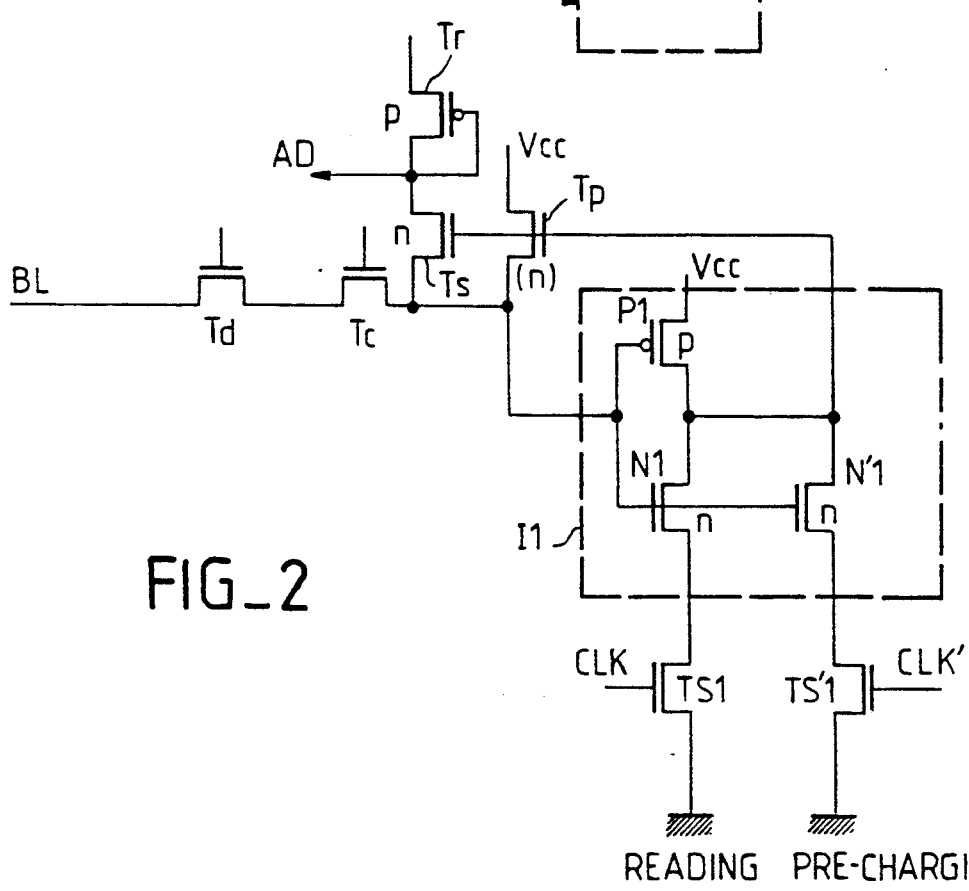
FIG_2

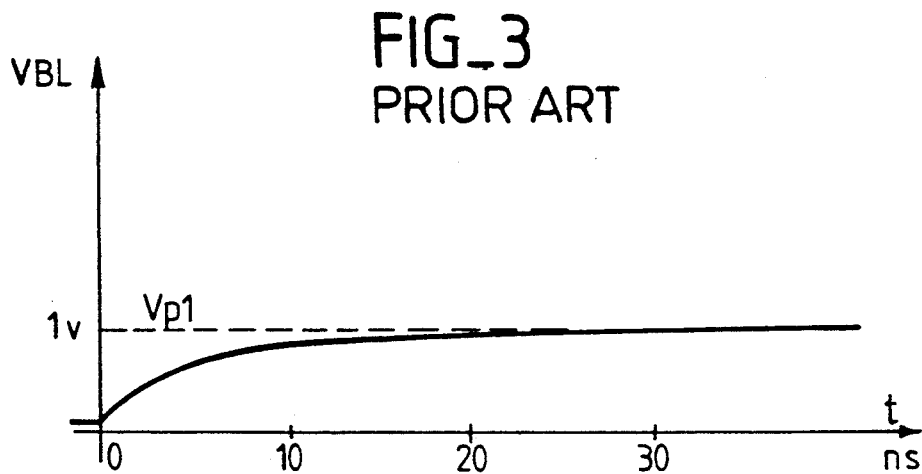
FIG_3
PRIOR ART
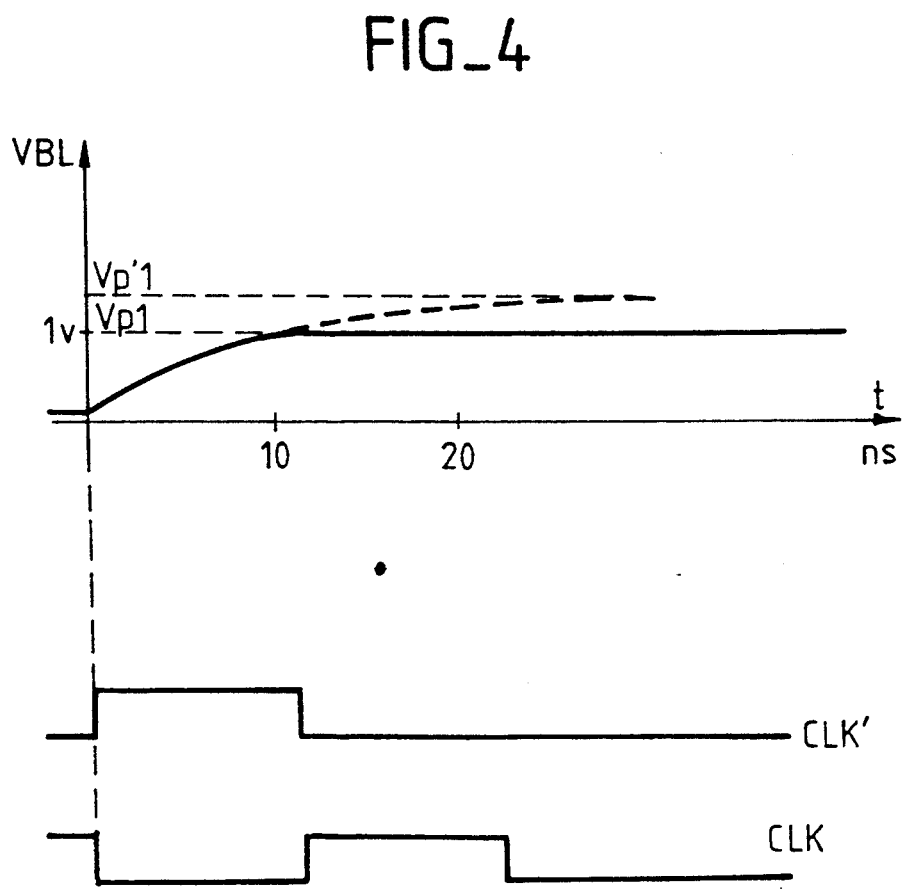
FIG_4

PRE-CHARGING METHOD FOR THE READING OF MEMORIES

BACKGROUND OF THE INVENTION

1. Field of the Invention

The invention relates to memory integrated circuits. It can be applied notably to electrically programmable read-only memories.

The memories are formed by networks of memory cells arranged in lines and columns. The addressing is done, for example, linewise and the reading is done columnwise. A word line is used to address a set of cells located on one and the same line and connected to this word line. The state of the cell is read on a conductor called a "bit line". This conductor is connected to a set of cells positioned along the same column of the network.

The state of a cell is read as follows: a decoder is used to select the line in which the cell is located, and the bit line corresponding to this cell is connected to a read amplifier. The reading is most usually done in two stages:

firstly, the bit line is pre-charged at a determined potential, for example about one volt;

secondly, the cell receives the appropriate voltages and consumes or does not consume current depending on its state (blank or programmed), the consequence of which is that it causes the variation of a potential AD at the output of a current/voltage converter.

The reading is done by comparison of the value AD and of the corresponding value given by a reference circuit connected to a blank cell.

The memory integrated circuits of this type therefore comprise a pre-charging circuit associated with the bit lines.

2. Description of the Prior Art

In the simplest prior art embodiments, the pre-charging circuit is constituted as in FIG. 1. It is connected between the bit line BL and a differential reading amplifier. It is used both to establish a pre-charging potential on the bit line and to send a signal to the reading amplifier. It can therefore be called a pre-charging and reading circuit.

This circuit is a so-called "i/v circuit". It is a current-voltage converter that gives a voltage which varies greatly with the input current. It detects the current absorbed by the cell at the instant of reading (the current depending on the memorization state of the cell). The output voltage of the circuit, highly dependent on the input current, is applied to the differential reading amplifier which flips in a certain direction depending on the state of the cell. During the pre-charging, before the reading, it is the same circuit that imposes a fixed pre-charging voltage on the bit line.

The circuit of FIG. 1 comprises a pre-charging transistor Tp having its drain connected to the supply voltage Vcc of the circuit and its source looped to its gate through an inverter I1 to set up a servo-control system imposing a fixed voltage on the source of the transistor Tp. The inverter I1 is herein constituted by two complementary MOS transistors having their gates joined together to constitute the input of the inverter, said input being connected to the source of Tp, and having their drains connected together to constitute the output of the inverter, said output being connected to the gate of Tp. The characteristics (threshold voltage and dimensions) of the pre-charging transistor Tp and those of the transistors of the inverter fix the value of the pre-charging voltage that the i/v circuit tends to impose on the bit line during the pre-charging operation.

The source of the transistor Tp constitutes the input of the i/v converter and it is connected to the bit line BL by means of transistors which are furthermore needed for the working of the memory: these are notably a read control transistor Tc and a transistor Td for the decoding of the bit line. A transistor Ts, having its source and its gate connected to the source and to the gate of the transistor Tp and being of the same type (N channel in this case) as Tp copies the current in the transistor Tp. The transistor Ts is in series with a transistor Tr mounted as a resistor and connected to the supply voltage Vcc. Tr is preferably a P channel transistor having its gate connected to its drain. The output of the converter is the junction point of the drains of the transistors Tr and Ts and gives a potential AD representing the current consumed by the transistor Tp, namely the current consumed on the bit line BL.

During the pre-charging stage, the transistors Tc and Td are conductive and behave like resistors. The bit line BL behaves like a capacitance with a relatively high value because all of the memory cells of an entire column are connected in parallel to this bit line. The result thereof is that the bit line gets precharged relatively slowly, tending exponentially towards the set value dictated by the transistor Tp and its looping inverter.

The slowness of the pre-charging operation is a drawback since it diminishes the overall access time for the reading of a memory cell. For a memory with an access time of 80 nanoseconds, the pre-charging time may last 25 nanoseconds, for example. It would be desirable to reduce this pre-charging time, either to have more time available for the reading proper or to reduce the total access time.

SUMMARY OF THE INVENTION

An aim of the invention is to reduce the bit line pre-charging time to the minimum while at the same time keeping the same performance characteristics for reading, and achieving this result without making the reading circuit excessively complicated.

To this end, the invention proposes to give the looping circuit of the pre-charging circuit different characteristics during the pre-charging phase and during the reading phase proper, so that, during the pre-charging, the circuit imposes a set value of pre-charging voltage that is higher than the set value voltage given during the reading phase proper.

An object of the invention, therefore, is notably a pre-charging and reading circuit for an integrated circuit memory comprising a pre-charging transistor and an inverter connected between the bit line and the gate of the pre-charging transistor, the transistor and the inverter constituting a servo-control circuit that imposes a set value of pre-charging voltage towards which the voltage of the bit line tends, this set value of voltage being related to the characteristics of the servo-control circuit, wherein there are provided means for the modification, during a pre-charging stage, of the characteristics of the pre-charging voltage servo-control circuit, so as to momentarily establish a set value of voltage that is higher than the pre-charging voltage desired for the reading, and then to return to a set value of voltage that is substantially equal to the desired pre-charging value.

A sequencing circuit is therefore provided to modify the structure of the inverter during these two phases. The duration of the first phase is preferably chosen so as to end when the voltage on the bit line substantially reaches the pre-charging value desired for the reading phase.

Preferably, the inverter has a P channel transistor in series with an N channel transistor, and a means to modify the dimension of one of the transistors of the inverter depending on the stage in progress.

For example, this transistor is actually constituted by two transistors in parallel, having different dimensions, which are parallel-connected, one of them being selected during one of the phases and the other being selected during the other phase. For example, the source of one of the transistors in parallel is connected to a supply terminal through a first selection transistor while the source of the other transistor is connected to the same terminal by means of the other selection transistor.

During the pre-charging phase, the pre-charging circuit may give a substantial current and may charge the bit line more speedily at the desired fixed voltage. During the reading phase, there is a return to a structure and dimensions of transistors that dictate a pre-charging set value very close to the desired pre-charging value, and that give a high current/voltage gain for the reading.

BRIEF DESCRIPTION OF THE DRAWINGS

Other features and advantages of the invention shall appear from the following detailed description, made with reference to the appended drawings, of which:

FIG. 1, which has already been described, represents a reading and pre-charging circuit already used prior to the invention;

FIG. 2 shows an exemplary circuit according to the invention;

FIG. 3 shows a curve of the build-up of the pre-charging voltage on the bit line with the circuit of FIG. 1; and FIG. 4 shows a curve of the build-up of the pre-charging voltage with the circuit of FIG. 2.

DETAILED DESCRIPTION OF THE INVENTION

The elements corresponding to those of FIG. 1 are designated in FIG. 2 by the same references: the bit line BL, connected to the pre-charging and reading circuit by means of a decoding transistor Td and a reading control transistor Tc, the pre-charging transistor Tp which gives the desired pre-charging voltage of about one volt for example and, finally, the transistors Tr and Ts enabling the current/voltage conversion proper.

The inverter I1 of FIG. 1 is replaced, according to the invention, by a circuit which plays the same role but which has characteristics that vary between the pre-charging phase and the reading phase proper.

In this example, the inverter again has a P channel transistor P1 in series with an N channel transistor. But there are actually two transistors N1 and N'1 in parallel, at least one of them being switched off. In the example shown, either one of the transistors is working. But it is also possible to provide for an operation where, during the reading stage, both transistors are working in parallel.

Each of the transistors N1 and N'1 is in series with a respective selection transistor TS1, TS'1 which enables the ground connection of the source of the transistor N1 or N'1 respectively. The selection transistor TS1 is made conductive during the reading phase proper, after the pre-charging phase. The transistor TS'1, on the contrary, is made conductive during the pre-charging phase.

Thus, during the pre-charging, the inverter is constituted practically by the transistors P1 and N'1 (or, more precisely, P1 and the assembly N'1/TS'1); during the reading phase proper, the inverter is constituted by the transistors P1 and N1/TS1.

A sequencing signal is then established. This sequencing signal makes TS1 or TS'1 conductive during predetermined periods.

In the same way as in FIG. 1, the looping of the source towards the drain of the transistor Tp through an inverter constitutes a servo-control system tending to impose a fixed voltage on the source of Tp, the level of this fixed voltage depending essentially on the characteristics (threshold voltage and dimensions) of the transistor and on those of the transistors of the inverter. By dimensions of the transistors, we mean essentially the ratio W/L, which equals the ratio of the channel width and channel length o the transistor.

According to the invention, the balancing voltage Vp'1 that the inverter tends to set up during the pre-charging phase, with the group N'1, TS'1 as the N channel transistor, is greater than the balancing voltage Vp1 that the inverter tends to set up with the group N1, TS1 as the N channel transistor. The latter balancing voltage is furthermore very close to the pre-charging voltage desired on the bit line, the voltage Vp'1 being, on the contrary, appreciably greater (for example, 30% greater).

At the instant of pre-charging, when the bit line BL to be precharged is connected by the transistors Td and Tc to the pre-charging and reading circuit, the voltage on the bit line BL tends exponentially towards the balancing voltage imposed by the transistor Tp looped by the inverter I1.

According to the invention, a clock signal CLK' is applied during the pre-charging phase to the gate of the selection transistor TS'1. This clock signal makes the selection transistor TS'1 conductive to make the inverter work with the transistor N'1 (or more precisely the group N'1, TS'1) as an N channel transistor. The potential of the bit line BL tends exponentially towards the potential Vp'1 which is higher than desired.

The duration of the clock signal CLK' is preferably computed so that the transistor TS'1 is off when the potential of the bit line BL has reached substantially the desired value. A clock signal CLK, which is preferably quite simply the logic complement of CLK', takes over to make the transistor TS1 conductive.

The transistor Tp and its inverter (now with the transistor N1 as an N channel transistor) then tend to establish the potential Vp1 on the bit line. Since this potential is practically already achieved owing to the already relatively swift charging of the bit line BL, the phase is ready for the reading phase proper. During this phase, the servo-control circuit is stabilized at the desired pre-charging potential Vp1 for the reading operation.

The pre-charging is thus accelerated notably without changing the characteristics of the circuit during the reading proper.

To obtain this fast pre-charging, in practice the transistor N'1 used during the pre-charging will be given a ratio W/L (ratio of channel width to channel length)

that is smaller than that of the transistor N1. This implies that the transistor N'1 alone is used during the pre-charging and that the transistor N1 alone is used subsequently.

However, it can also be seen that, during the pre-charging, the transistor N'1 can be used alone and that, during the reading, the transistors N1 and N'1 can be used in parallel to form a bigger transistor. This naturally changes the relative dimensions to be given to the two transistors.

It is also possible to bring the relative dimensions of the P channel transistors into play to define a set value voltage Vp'1 that is greater during the pre-charging than the actually desired pre-charging voltage Vp1. And it is also possible to combine action on the P channel transistor with action on the N channel transistor, or even to substitute one inverter for another one with a different constitution to obtain the same result.

Finally it is possible, if necessary, to act on the pre-charging transistor Tp itself rather than on the transistors of the inverter.

The system can be protected by the addition, in parallel with the circuit, of a voltage limiter prohibiting any excessive build-up of voltage on the bit line;

FIGS. 3 and 4 illustrate the build-up of potential of the bit line BL with the circuit of FIG. 1 and with the circuit of FIG. 2, respectively.

In FIG. 3, corresponding to the circuit of FIG. 1, starting from the instant when the bit line BL is connected by transistors Td and Tc to the pre-charging and reading circuit, it is necessary to wait for a period, which for example may be about thirty nanoseconds, before the potential of the bit line reaches approximately the desired set value Vp1.

In FIG. 4, the potential build-up is far swifter during the rectangular voltage pulse CLK' which makes the transistor TS'1 conductive and as soon as the end of this pulse, or almost at its end (for example at the end of 10 to 12 nanoseconds, it is possible to do the reading for the potential of the bit line is stabilized at the right value Vp1.

The digital values given assume that, in both cases, it is sought to obtain the same pre-charging potential, with the same characteristics of capacitance and resistance values of the connection of the bit line.

What is claimed is:

1. A pre-charging and reading circuit for an integrated circuit memory comprising:
   a bit line for communicating with a memory cell, said memory cell having either a programmed state or an unprogrammed state;
   a pre-charging node;
   a first transistor for selectively connecting said bit line to said pre-charging node during a reading operation;
   a current/voltage converter connected to said pre-charging node and having an output for communicating a signal to a differential amplifier, said signal representing said state of said memory cell;
   a pre-charging transistor coupling said pre-charging node to a first voltage source;
   a servo-control circuit connected between said pre-charging node and a second voltage source, said servo-control circuit having an output connected to the gate of said pre-charging transistor, said servo-control circuit producing a first output voltage on said output during a pre-charging phase and a second output voltage on said output during a reading phase, said first output voltage driving said pre-charging transistor so as to cause said pre-charging node to charge toward a first voltage value, said second output voltage driving said pre-charging transistor so as to maintain said pre-charging node at a desired voltage value, wherein said first voltage value exceeds said desired voltage value.

2. A pre-charging and reading circuit in accordance with claim 1 further comprising a selection circuit adapted to change said output of said servo-control circuit from said first output voltage to said second output voltage when the voltage on the bit line is substantially equal to the desired voltage value.

3. A pre-charging and reading circuit in accordance with claim 1, wherein the servo-control circuit has second, third, and fourth transistors, each having a respective gate, the type of conductivity of said second transistor being opposite to the type of conductivity of said third and fourth transistors, the channel width to channel length ratio of said third transistor being different from the channel width to channel length ratio of said fourth transistor.

4. A pre-charging and reading circuit in accordance with claim 3 wherein said gate of each of said second, third and fourth transistor is coupled to said pre-charging node.

5. A pre-charging and reading circuit in accordance with claim 4 wherein said second transistor is a P type transistor and said third and fourth transistors are N type transistors.

6. A pre-charging and reading circuit in accordance with claim 2 wherein said selection circuit comprises a first selection transistor connected in series with a third transistor and a second selection transistor connected in series with a fourth transistor, said first selection transistor being selected by an activating pulse to the gate of said first selection transistor, and said second selection transistor being selected by an activating pulse to the gate of said second selection transistor.

7. A pre-charging and reading circuit in accordance with claim 6 wherein said activating pulse to the gate of said selection transistors comprises a first clock signal to the gate of said first selection transistor and a second clock signal to the gate of said second selection transistor said second clock signal being the logic complement to said first clock signal.

8. A pre-charging and reading circuit in accordance with claim 1 wherein said current/voltage converter comprises a first and second output transistors connected in series between the bit line and said first voltage source, one of said first and second output transistors being a P type transistor and the other one being an N type transistor, the gate of one of said first and second output transistors being connected to the output of said servo-control circuit, the gate of the other of said first and second output transistors being connected to the common node of said first and second output transistors.

9. In an integrated memory circuit, a method for pre-charging a pre-charging node on a bit line comprising the steps of:
   applying a first output voltage from a servo-control circuit to a driving circuit for rapidly charging said pre-charging node toward a first voltage value; and
   applying a second output voltage from said servo-control circuit to said driving circuit for maintaining said pre-charging node at a desired voltage value, wherein said first voltage value is greater than said desired voltage value.

10. The method for pre-charging a pre-charging node according to claim 9 wherein said driving circuit is a pre-charging transistor.

11. The pre-charging method according to claim 9 wherein said servo-control circuit is switched from said first output voltage to said second output voltage when said pre-charging node has substantially attained desired voltage value.

12. The pre-charging method according to claim 11 wherein said driving circuit is a pre-charging transistor.

* * * * *